(12) United States Patent
Chiang et al.

(10) Patent No.: US 11,908,510 B2
(45) Date of Patent: Feb. 20, 2024

(54) FUSE DEVICE AND OPERATION METHOD THEREOF

(71) Applicant: NANYA TECHNOLOGY CORPORATION, New Taipei (TW)

(72) Inventors: Chao-Yu Chiang, Taoyuan (TW); Chih-Hsuan Chen, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 163 days.

(21) Appl. No.: 17/686,362

(22) Filed: Mar. 3, 2022

(65) Prior Publication Data
US 2023/0282269 A1    Sep. 7, 2023

(51) Int. Cl.
*G11C 17/18*    (2006.01)
*G11C 11/4078*    (2006.01)
*G11C 11/408*    (2006.01)
*H03K 19/20*    (2006.01)

(52) U.S. Cl.
CPC ...... *G11C 11/4078* (2013.01); *G11C 11/4087* (2013.01); *H03K 19/20* (2013.01)

(58) Field of Classification Search
CPC .. G11C 11/4078; G11C 11/4087; H03K 19/20
USPC ...................................................... 365/225.7
See application file for complete search history.

(56) References Cited

U.S. PATENT DOCUMENTS

| | | | | |
|---|---|---|---|---|
| 5,859,801 A * | 1/1999 | Poechmueller | ...... | G11C 29/808 365/240 |
| 5,953,267 A | 9/1999 | Oh | | |
| 6,272,061 B1 * | 8/2001 | Kato | ...... | G11C 5/025 365/225.7 |
| 6,335,897 B1 * | 1/2002 | Yoo | ...... | G11C 29/808 365/225.7 |
| 7,450,459 B2 * | 11/2008 | Park | ...... | G11C 29/785 365/201 |
| 7,539,074 B2 | 5/2009 | Ko | | |
| 9,894,281 B2 * | 2/2018 | Nishi | ...... | H04N 25/134 |
| 2009/0002119 A1 | 1/2009 | Nirschl | | |

FOREIGN PATENT DOCUMENTS

EP    1024431    3/2004

OTHER PUBLICATIONS

"Notice of allowance of Taiwan Counterpart Application", dated Jan. 16, 2023, p. 1-p. 3.

* cited by examiner

*Primary Examiner* — Tha-O H Bui
(74) *Attorney, Agent, or Firm* — JCIPRNET

(57) ABSTRACT

The fuse device includes a plurality of fuse circuits, a global latch circuit and a plurality of local latch circuits. The global latch circuit is coupled to the fuse circuits. The global latch circuit is used to sense the blown states of the fuse circuits at different times, so as to output the fuse information of the fuse circuits at the different times. The local latch circuits are coupled to the global latch circuits. Each of these local latch circuits latches the fuse information output by the global latch circuit at the different times.

10 Claims, 6 Drawing Sheets

FUSE DEVICE AND OPERATION METHOD THEREOF

BACKGROUND

Technical Field

The disclosure relates to an information latch circuit, and particularly relates to a fuse device and an operation method thereof.

Description of Related Art

Fuse or anti-fuse can be applied to various electronic circuits in order to latch different information (fuse information). For example, a dynamic random-access memory (DRAM) chip can utilize an anti-fuse to determine which redundant row and/or redundant column to turn on. For the anti-fuse, the blown anti-fuse has a low resistance value, while the un-blown anti-fuse has a high resistance value. Based on the material of the anti-fuse, in some embodiments, the resistance value of the blown anti-fuse may be in the range of 2 to 100 KΩ, while the resistance value of the un-blown anti-fuse may be in the range of 5000 to 20,000 KΩ. The fuse latch circuit can sense the resistance state (blown state) of the anti-fuse, and then latch the fuse information of the anti-fuse. In addition, the fuse latch circuit can coordinate the blown operation of the anti-fuse. Generally speaking, an anti-fuse (fuse circuit) needs to be equipped with an exclusive fuse latch circuit. The greater the number of fuse circuits, the greater the number of exclusive fuse latch circuits. It is one of many important issues in this technical field to explore how to reduce the circuit area.

SUMMARY

The disclosure provides a fuse device and an operation method thereof, so that multiple fuse circuits share a global latch circuit.

In an embodiment of the disclosure, the fuse device includes a plurality of fuse circuits, a global latch circuit and a plurality of local latch circuits. The global latch circuit is coupled to the fuse circuits. The global latch circuit is configured to sense the blown states of the fuse circuits at different times, so as to output the fuse information of the fuse circuits at the different times. The local latch circuits are coupled to the global latch circuits. Each of these local latch circuits latches the fuse information output by the global latch circuit at the different times.

In an embodiment of the disclosure, the operation method includes: sensing the blown states of multiple fuse circuits of the fuse device at different times by the global latch circuit of the fuse device; outputting the fuse information of these fuse circuits by the global latch circuit at the different times; and latching the fuse information output by the global latch circuit at the different times by the multiple local latch circuits of the fuse device.

Based on the above, the global latch circuit of the fuse device according to the embodiments of the disclosure can sense the resistance state (blown state) of any fuse circuit at different times, and then output the fuse information to the corresponding local latch circuit. In addition, the global latch circuit can coordinate the blown operation of any fuse circuit. That is, multiple fuse circuits can share the same global latch circuit in time-division.

In order to make the above-mentioned features and advantages of the disclosure more comprehensive, the following specific embodiments are described in detail in conjunction with the accompanying drawings.

DESCRIPTION OF THE EMBODIMENTS

Figure 1:
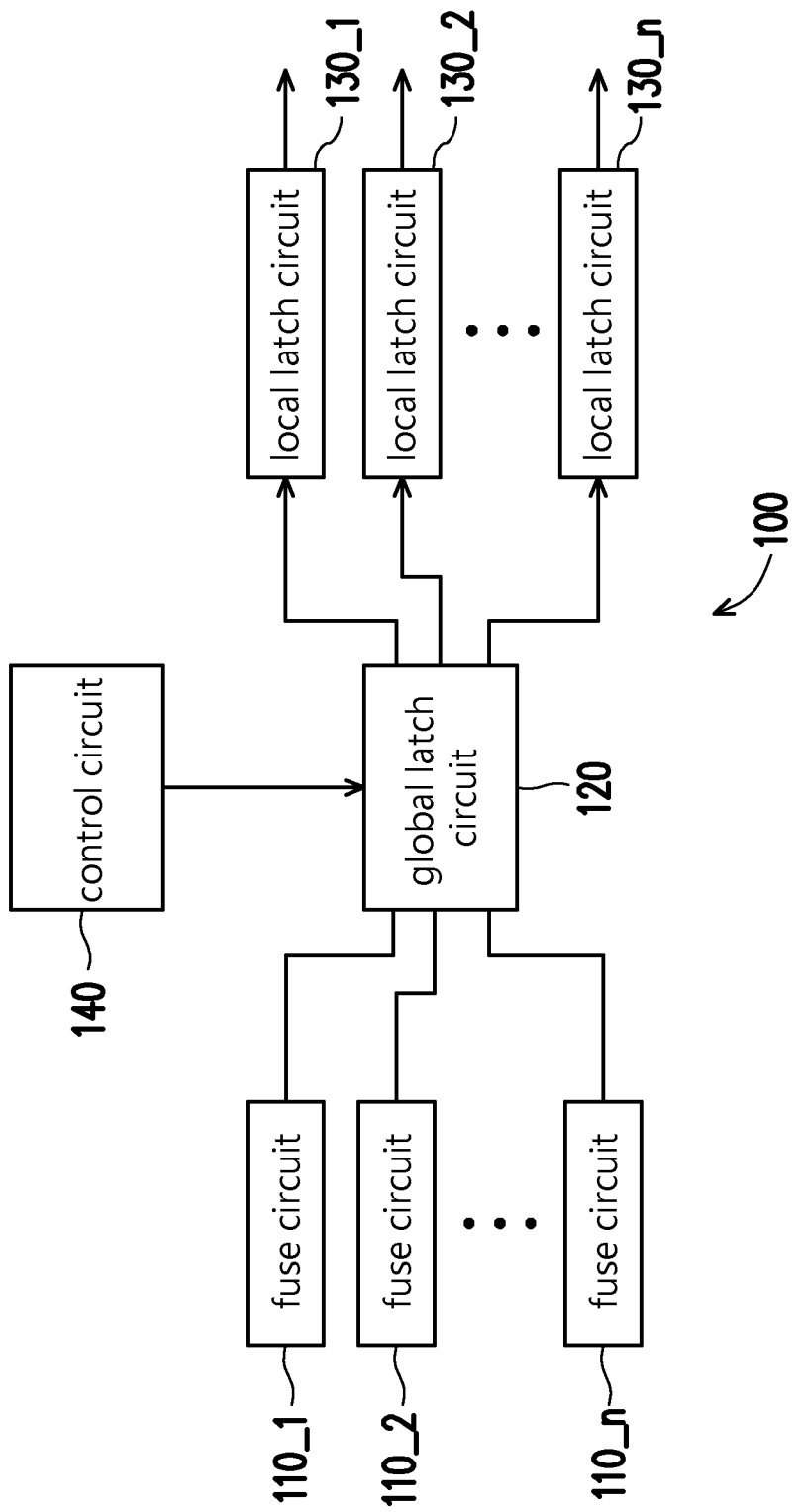
FIG. 1 is a circuit block diagram of a fuse device according to an embodiment of the disclosure.

The term "coupling (or connected)" used in the full text (including claims) in the specification of this disclosure can refer to any direct or indirect connection means. For example, if the text describes that the first device is coupled (or connected) to the second device, it should be interpreted as that the first device can be directly connected to the second device, or the first device can be indirectly connected to the second device through other devices or a certain connection means. The terms "first" and "second" mentioned in the full text (including claims) of the disclosure are used to name the element, or to distinguish between different embodiments or scopes, and are not used to restrict the upper limit or lower limit of the number of elements, and not used to limit the sequence of element. In addition, wherever possible, elements/components/steps with the same reference numbers in the drawings and embodiments represent the same or similar parts. Elements/components/steps that are denoted by the same reference numerals or the same terms in different embodiments may serve as cross reference for each other.

FIG. 1 is a circuit block diagram of a fuse device 100 according to an embodiment of the disclosure. The fuse device 100 includes a plurality of fuse circuits, such as the fuse circuits 110_1, 110_2, . . . , 110_n shown in FIG. 1. The number n of the fuse circuits 110_1 to 110_n can be determined according to the actual design. The fuse device 100 further includes a plurality of local latch circuits, such as the local latch circuits 130_1, 130_2, . . . , 130_n shown in FIG. 1. The global latch circuit 120 of the fuse device 100 is coupled between the fuse circuits 110_1 to 110_n and the local latch circuits 130_1 to 130_n.

Figure 2:
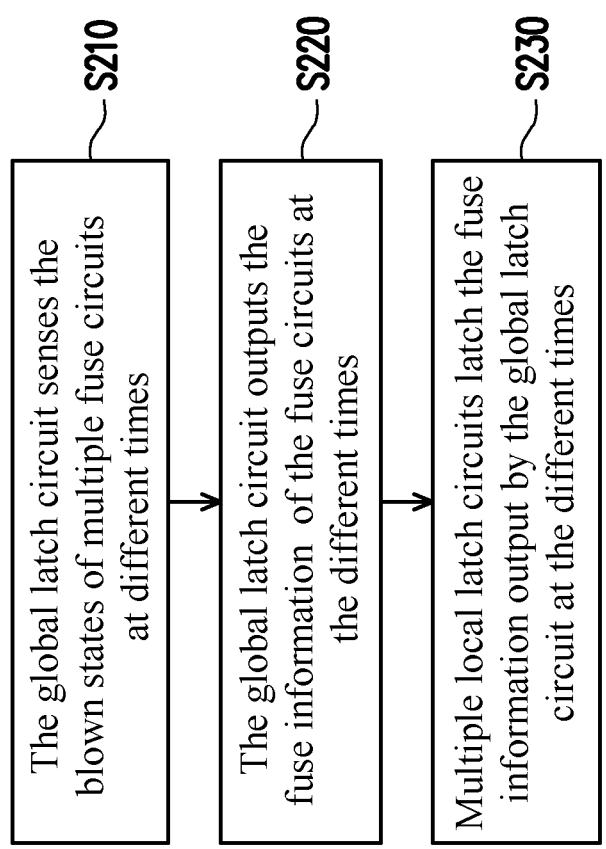
FIG. 2 is a schematic flowchart of an operation method of a fuse device according to an embodiment of the disclosure.

FIG. 2 is a schematic flowchart of an operation method of a fuse device according to an embodiment of the disclosure. Please refer to FIG. 1 and FIG. 2. Based on the control of the control circuit 140, the global latch circuit 120 can sense the blown state of the fuse circuits 110_1 to 110_n at different times (step S210), so as to output the fuse information (blown state) of the fuse circuits 110_1 to 110_n at the different times to the local latch circuits 130_1 to 130_n (step S220). Each of the local latch circuits 130_1 to 130_n can latch the fuse information output by the global latch circuit 120 at the different times (step S230).

For example, the global latch circuit 120 can sense the blown state of the fuse circuit 110_1 during the first read time and output the fuse information of the fuse circuit 110_1 to the local latch circuit 130_1, so that the local latch circuit 130_1 can latch the fuse information of the fuse circuit 110_1 during the first read time. During the second read time, the global latch circuit 120 can sense the blown state of the fuse circuit 110_2 and output the fuse information of the fuse circuit 110_2 to the local latch circuit 130_2, so that the local latch circuit 130_2 can latch the fuse information of the fuse circuit 110_2. Deduced by analogy, during the n-th read time, the global latch circuit 120 can sense the blown state of the fuse circuit 110_$n$ and output the fuse information of the fuse circuit 110_$n$ to the local latch circuit 130_$n$, so that the local latch circuit 130_$n$ can latch the fuse information of the fuse circuit 110_$n$.

In summary, the global latch circuit 120 of the fuse device 100 of this embodiment can sense the resistance state (blown state) of any fuse circuit at different times, and then output its fuse information to the corresponding local latch circuit. In addition, the global latch circuit 120 can coordinate the blown operation of any fuse circuit. In this manner, multiple fuse circuits 110_1 to 110_$n$ can share the same global latch circuit 120 in time-division to save circuit area.

Figure 3:
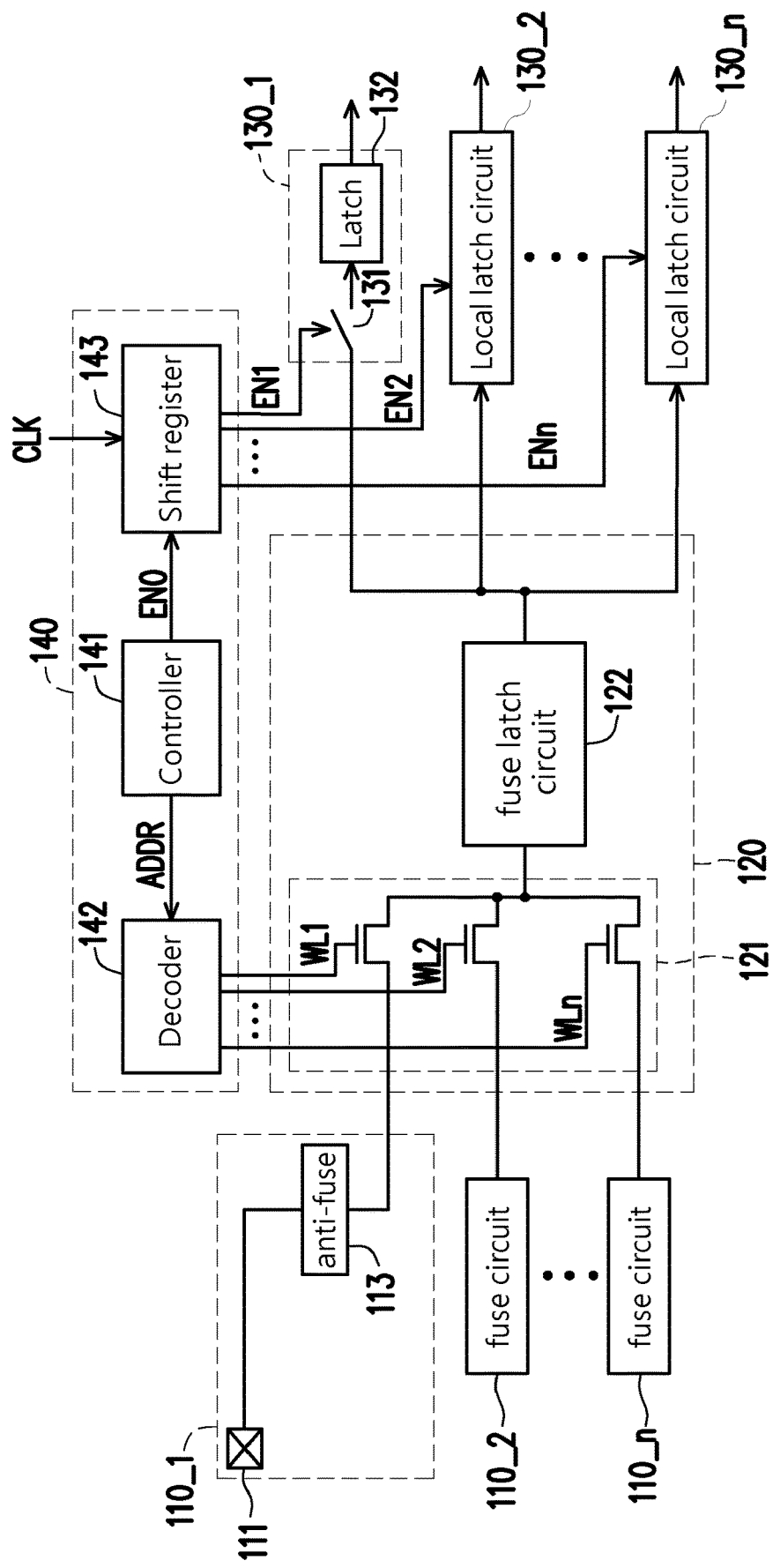
FIG. 3 is a circuit block diagram of a fuse circuit, a global latch circuit, and a local latch circuit according to an embodiment of the disclosure.

FIG. 3 is a circuit block diagram of the fuse circuit 1101, the global latch circuit 120, and the local latch circuit 130_1 according to an embodiment of the disclosure. The circuit shown in FIG. 3 can be used as one of many implementation examples of the fuse device 100 shown in FIG. 1. The implementation details of other fuse circuits 110_2 to 110_$n$ in the fuse device 100 can be deduced by analogy with reference to the related description of the fuse circuit 110_1 shown in FIG. 3, and the implementation details of other local latch circuits 130_2 to 130_$n$ in the fuse device 100 can be deduced by analogy with the related description of the local latch circuit 130_1 shown in FIG. 3, so no repetition is incorporated herein.

In the embodiment shown in FIG. 3, the fuse circuit 110_1 includes a blown pad 111, and an anti-fuse 113. The first terminal of the anti-fuse 113 is coupled to the global latch circuit 120. The blown pad 111 is coupled to the second terminal of the anti-fuse 113. When the anti-fuse 113 is blown, the blown pad 111 may be coupled to an external blown voltage source (not shown). When the anti-fuse 113 is not blown, the blown pad 111 can be electrically floating, that is, the blown pad 111 is not coupled to an external blown voltage source.

In the embodiment shown in FIG. 3, the global latch circuit 120 includes a selection circuit 121 and a fuse latch circuit 122. The fuse latch circuit 122 is coupled to the common terminal of the selection circuit 121. The output terminal of the fuse latch circuit 122 is coupled to the input terminal of each of the local latch circuits 130_1 to 130_$n$. The fuse latch circuit 122 can sense the resistance states (blown states) of the fuse circuits 110_1 to 110_$n$ at different times, and then output its fuse information to the corresponding local latch circuit. In addition, the fuse latch circuit 122 can coordinate the blown operation of any one of the fuse circuits. This embodiment provides no specific implementation to the fuse latch circuit 122. For example, according to the actual design, the fuse latch circuit 122 can be the fuse latch circuit 122 shown in FIG. 5 (details will be provided later), or a known fuse latch circuit, or other fuse latch circuits.

The multiple selection terminals of the selection circuit 121 are coupled to the first terminals of the anti-fuses of the fuse circuits 110_1 to 110_$n$ in a one-to-one manner. The selection circuit 121 can selectively couple one of the fuse circuits 110_1 to 110_$n$ to the fuse latch circuit 122. The selection circuit 121 is controlled by the word line signals WL1, WL2, . . . , WLn of the control circuit 140. When the word line signal WL1 is at a high logic level, the selection circuit 121 can selectively couple the first terminal of the anti-fuse 113 of the fuse circuit 110_1 to the fuse latch circuit 122. When the word line signal WL2 is at a high logic level, the selection circuit 121 can selectively couple the first terminal of the anti-fuse (not shown) of the fuse circuit 110_2 to the fuse latch circuit 122. Deduced by analogy, when the word line signal WLn is at a high logic level, the selection circuit 121 can selectively couple the first terminal of the anti-fuse (not shown) of the fuse circuit 110_$n$ to the fuse latch circuit 122.

For example, the selection circuit 121 may selectively couple the first terminal of the anti-fuse 113 of the fuse circuit 110_1 to the fuse latch circuit 122 during the first read time, so that the fuse latch circuit 122 can sense and latch the fuse information (blown state) of the fuse circuit 110_1 during the first read time, and output the fuse information of the fuse circuit 110_1 to the local latch circuit 130_1. During the second read time, the selection circuit 121 can selectively couple the first terminal of the anti-fuse of the fuse circuit 110_2 to the fuse latch circuit 122, so that the fuse latch circuit 122 can sense and latch the fuse information of the fuse circuit 110_2, and output the fuse information of the fuse circuit 110_2 to the local latch circuit 130_2. Deduced by analogy, during the n-th read time, the selection circuit 121 can selectively couple the first terminal of the anti-fuse of the fuse circuit 110_$n$ to the fuse latch circuit 122, so that the fuse latch circuit 122 can sense and latch the fuse information of the fuse circuit 110_$n$, and output the fuse information of the output fuse circuit 110_$n$ to the local latch circuit 130_$n$.

In the embodiment shown in FIG. 3, the control circuit 140 includes a controller 141 and a decoder 142. The controller 141 can generate a fuse address ADDR. The decoder 142 is coupled to the controller 141 to receive the fuse address ADDR. The decoder 142 can decode the fuse address ADDR to generate a plurality of word line signals WL1 to WLn to the selection circuit 121. For example (but not limited thereto), when the fuse address ADDR represents the value "0", the word line signal WL1 is logic "1" and the remaining word line signals WL2 to WLn are logic "0". When the fuse address ADDR represents the value "1", the word line signal WL2 is logic "1" and the remaining word line signals are logic "0". Deduced by analogy, when the fuse address ADDR represents the value "n-1", the word line signal WLn is logic "1" and the remaining word line signals are logic "0". The selection circuit 121 can select one of the fuse circuits 110_1 to 110_$n$ according to the word line signals WL1 to WLn.

Figure 4:
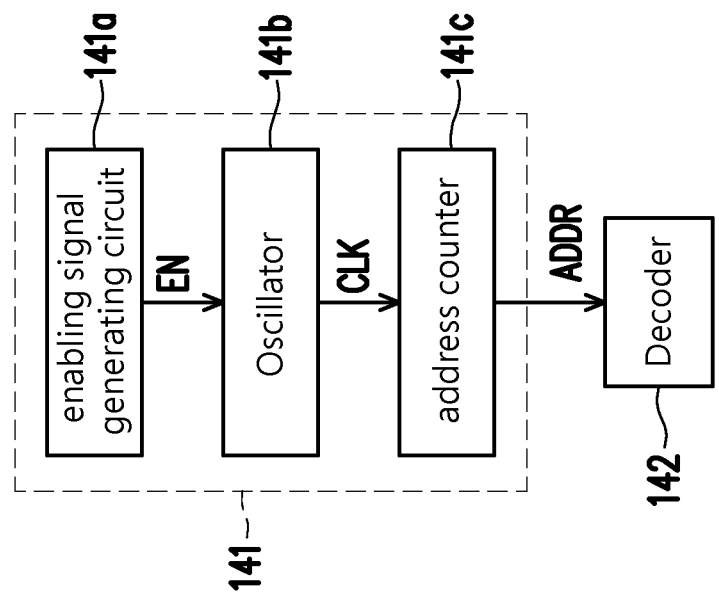
FIG. 4 is a circuit block diagram of a controller according to an embodiment of the disclosure.

FIG. 4 is a circuit block diagram of the controller 141 according to an embodiment of the disclosure. The controller 141 shown in FIG. 4 can be used as one of many implementation examples of the controller 141 shown in FIG. 3. In the embodiment shown in FIG. 4, the controller 141 includes an enabling signal generating circuit 141$a$, an oscillator 141$b$, and an address counter 141$c$. When the fuse device 100 enters the fuse information reading period, the enabling signal generating circuit 141$a$ can generate the enabling signal EN to the oscillator 141$b$. The oscillator 141$b$ is controlled by the enabling signal EN to selectively generate the clock CLK. For example, when the enabling signal EN is at a high logic level, the oscillator 141$b$ can generate the clock CLK. When the enabling signal EN is at a low logic level, the oscillator 141$b$ can stop generating the clock CLK. The address counter 141$c$ is coupled to the oscillator 141$b$ to receive the clock CLK. The address counter 141c can count the clock CLK to generate the fuse address ADDR for the decoder 142.

Figure 5:
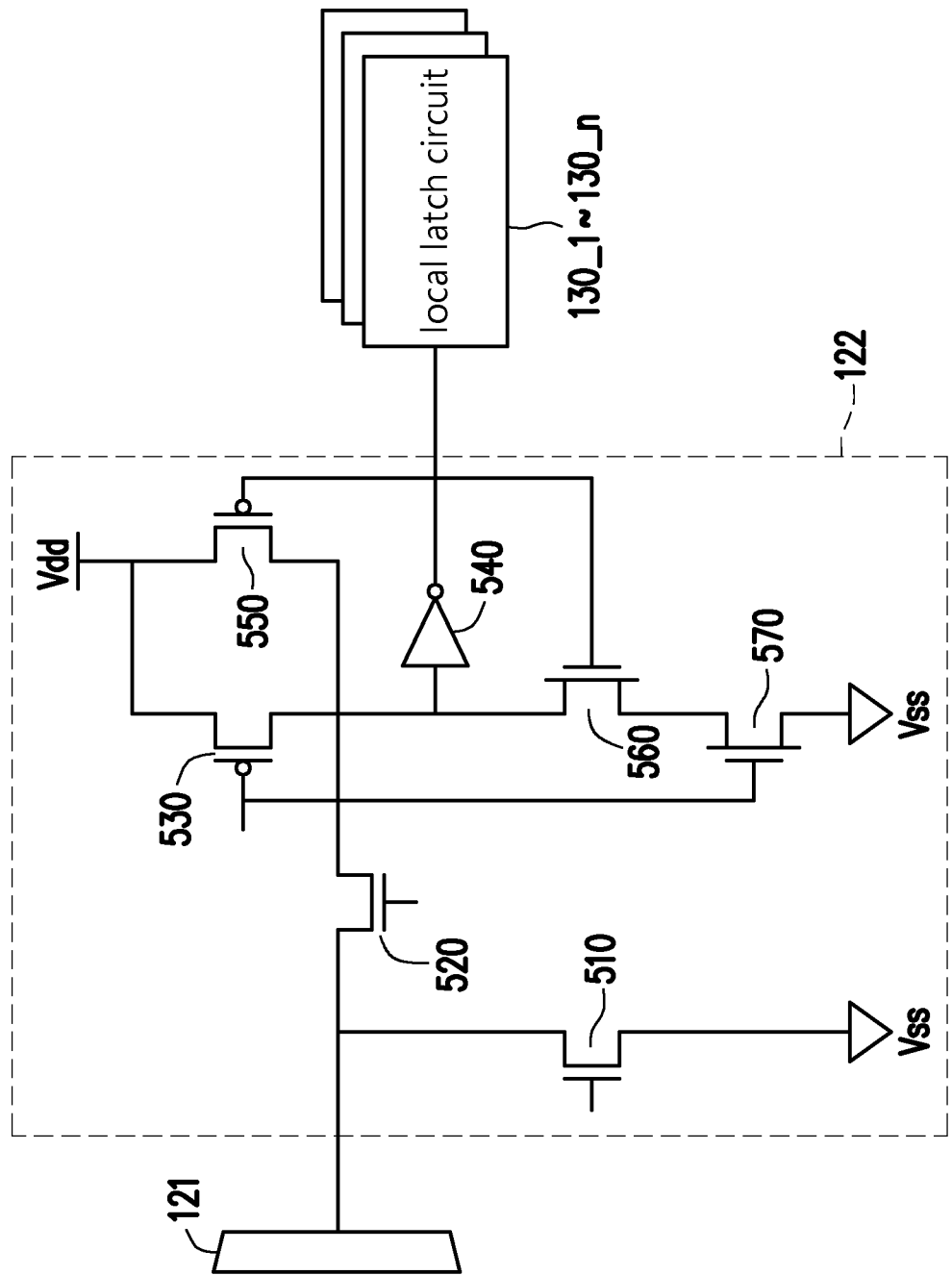
FIG. 5 is a circuit block diagram of a fuse latch circuit according to an embodiment of the disclosure.

FIG. 5 is a circuit block diagram of the fuse latch circuit 122 according to an embodiment of the disclosure. The fuse latch circuit 122 shown in FIG. 5 can be used as one of many implementation examples of the fuse latch circuit 122 shown in FIG. 3. In the embodiment shown in FIG. 5, the fuse latch circuit 122 includes a blown switch 510, an enable switch 520, a read switch 530, a NOT gate 540, a transistor 550, a transistor 560, and a transistor 570. The first terminal of the blown switch 510 is coupled to the common terminal of the selection circuit 121. The second terminal of the blown switch 510 is coupled to the reference voltage source Vss. The level of the reference voltage source Vss can be determined according to the actual design. For example, the reference voltage source Vss can provide a ground voltage or other fixed voltages. When any one of the fuse circuits 110_1 to 110_n_ is blown, the blown switch 510 is turned on. For example, when the fuse circuit 110_1 is blown, an external blown voltage source (not shown) is coupled to the blown pad 111, and the selection circuit 121 selectively couples the first terminal of the anti-fuse 113 of the fuse circuit 110_1 to the fuse latch circuit 122, and the blown switch 510 is turned on. Therefore, the external blown voltage source can blow the anti-fuse 113 of the fuse circuit 110_1. When the fuse circuits 110_1 to 110_n_ are not blown, the blown switch 510 is turned off.

The first terminal of the enable switch 520 is coupled to the common terminal of the selection circuit 121. The first terminal of the read switch 530 is coupled to the read voltage source Vdd. The level of the read voltage source Vdd can be determined according to the actual design. The second terminal of the read switch 530 is coupled to the second terminal of the enable switch 520. A control terminal of the transistor 570 is coupled to a control terminal of the read switch 530 and control by a same read signal. When reading/sensing any one of the fuse circuits 110_1 to 110_n_, the enable switch 520 and the read switch 530 are turned on, and the transistor 570 is turned off. When the fuse circuits 110_1 to 110_n_ are not read, the enable switch 520 and the read switch 530 are turned off, and the transistor 570 is turned on. The enable switch 520 is turned on any time, except when blowing any one of the fuse circuits 110_1 to 110_n_. The input terminal of the NOT gate 540 is coupled to the second terminal of the enable switch 520. The output terminal of the NOT gate 540 is coupled to the output terminal of the fuse latch circuit 122.

The first terminal (for example, the source) of the transistor 550 is coupled to the read voltage source Vdd. The second terminal (for example, the drain) of the transistor 550 is coupled to the input terminal of the NOT gate 540. The control terminal (such as the gate) of the transistor 550 is coupled to the output terminal of the NOT gate 540. The first terminal (for example, the drain) of the transistor 560 is coupled to the input terminal of the NOT gate 540. The control terminal (such as the gate) of the transistor 560 is coupled to the output terminal of the NOT gate 540. The first terminal (for example, the source) of the transistor 570 is coupled to the reference voltage source Vss. The second terminal (for example, the drain) of the transistor 570 is coupled to the second terminal (for example, the source) of the transistor 560. When reading any one of the fuse circuits 110_1 to 110_n_, the transistor 570 is turned off. When the fuse circuits 110_1 to 110_n_ are not read, the transistor 570 is turned on.

In the embodiment shown in FIG. 3, the local latch circuit 130_1 includes a switch 131 and a latch 132. The implementation details of other local latch circuits 130_2 to 130_n_ in the fuse device 100 can be deduced by analogy with reference to the relevant description of the local latch circuit 130_1 shown in FIG. 3, so no repetition is incorporated herein. The first terminal of the switch 131 is coupled to the output terminal of the fuse latch circuit 122 of the global latch circuit 120. The second terminal of the switch 131 is coupled to the input terminal of the latch 132. When the global latch circuit 120 reads one corresponding fuse circuit among the fuse circuits 110_1 to 110_n_, the switch 131 is turned on to transmit the fuse information of the corresponding fuse circuit to the input terminal of the latch 132. When the global latch circuit 120 does not read the corresponding fuse circuit, the switch 131 is turned off.

For example, when the global latch circuit 120 reads the fuse circuit 1101 (the corresponding fuse circuit of the local latch circuit 130_1), the switch 131 is turned on to transmit the fuse information of the fuse circuit 110_1 to the latch 132. When the global latch circuit 120 does not read the fuse circuit 110_1, the switch 131 is turned off. Deduced by analogy, when the global latch circuit 120 reads the fuse circuit 110_2 (the corresponding fuse circuit of the local latch circuit 130_2), the switch (not shown) of the local latch circuit 130_2 is turned on to transmit the fuse information of the fuse circuit 110_2 to the latch (not shown) of the local latch circuit 130_2. When the global latch circuit 120 reads the fuse circuit 110_n_ (the corresponding fuse circuit of the local latch circuit 130_n_), the switch (not shown) of the local latch circuit 130_n_ is turned on to transmit the fuse information of the fuse circuit 110_n_ to the latch (not shown) of the local latch circuit 130_n_.

In the embodiment shown in FIG. 3, the control circuit 140 further includes a shift register 143. The shift register 143 is coupled to the controller 141 to receive the source enable pulse EN0 generated by the controller 141. The shift register 143 may shift the source enable pulse EN0 based on the clock CLK to generate a plurality of enable pulses EN1, EN2, . . . ENn with different phases for the local latch circuits 130_1 to 130_n_. The switch (such as switch 131) in each of the local latch circuits 130_1 to 130_n_ can latch the fuse information output by the fuse latch circuit 122 of the global latch circuit 120 according to one corresponding enable pulse among the enable pulses EN1 to ENn.

Figure 6:
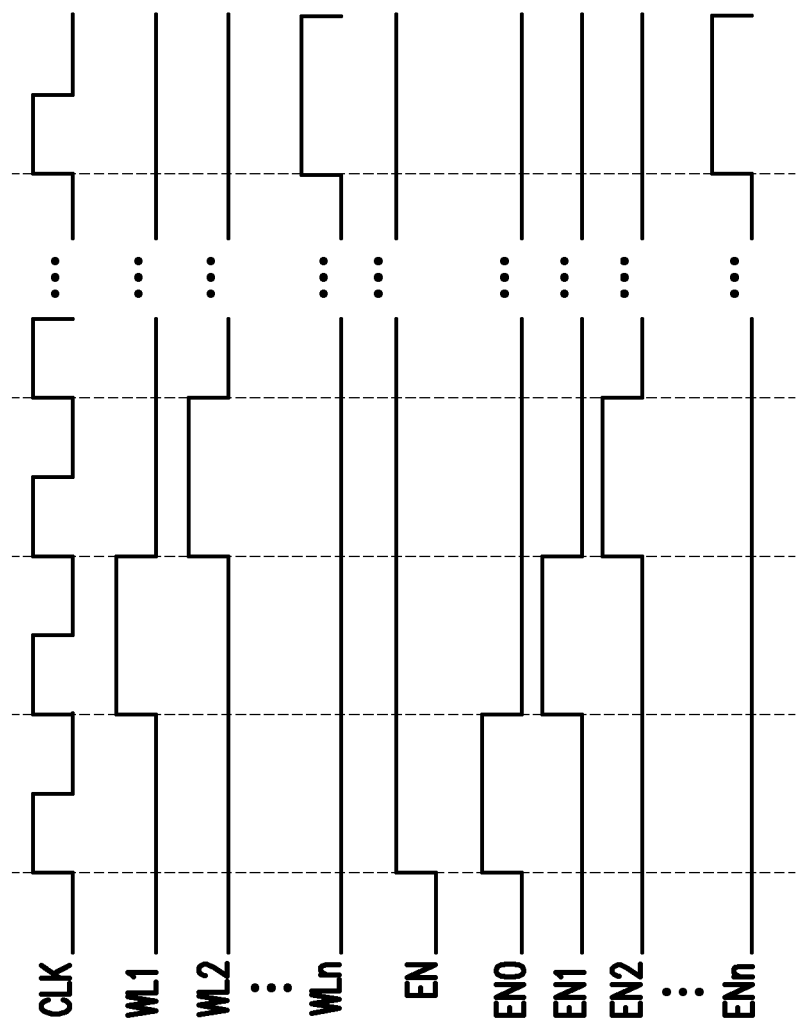
FIG. 6 is a schematic diagram illustrating the timing of the word line signal and the enable pulse according to an embodiment of the disclosure.

FIG. 6 is a schematic diagram illustrating the timing of the word line signals WL1 to WLn and the enable pulses EN1 to ENn according to an embodiment of the disclosure. The horizontal axis shown in FIG. 6 represents time. The enabling signal EN and the clock CLK shown in FIG. 6 can serve as an example of the enabling signal EN and the clock CLK shown in FIG. 4. The word line signals WL1 to WLn shown in FIG. 6 can serve as an example of the word line signals WL1 to WLn shown in FIG. 3. The source enable pulse EN0 and the enable pulses EN1 to ENn shown in FIG. 6 can serve as an example of the source enable pulse EN0 and the enable pulses EN1 to ENn shown in FIG. 3.

In summary, the global latch circuit 120 of the fuse device 100 described in the foregoing embodiments can sense the resistance state (blown state) of any one of the fuse circuits 110_1 to 110_n_ at different times, and then output the fuse information of the fuse circuits 110_1 to 110_n_ to the corresponding local latch circuits 130_1 to 130_n_ at different times. In addition, the global latch circuit 120 can coordinate the blown operation of any one of the fuse circuits 110_1 to 110_n_. That is, the multiple fuse circuits 110_1 to 110_n_ can share the same global latch circuit 120 in time-division to save circuit area.

Although the disclosure has been disclosed in the above embodiments, it is not intended to limit the disclosure. Anyone with ordinary knowledge in the technical field can make some changes and refinement without departing from the spirit and scope of the disclosure. Therefore, the scope to be protected by the disclosure shall be subject to those defined by the following claims.

What is claimed is:

1. A fuse device, comprising:
a plurality of fuse circuits;
a global latch circuit, coupled to the plurality of fuse circuits, configured for sensing blown states of the plurality of fuse circuits at different times, so as to output fuse information of the plurality of fuse circuits at the different times; and
a plurality of local latch circuits, coupled to the global latch circuit, wherein each of the plurality of local latch circuits latches the fuse information output by the global latch circuit at the different times.

2. The fuse device according to claim 1, wherein each of the plurality of fuse circuits comprises:
an anti-fuse, having a first terminal coupled to the global latch circuit; and
a blown pad, coupled to a second terminal of the anti-fuse, configured for coupling to an external blown voltage source when the anti-fuse is blown.

3. The fuse device according to claim 1, wherein the global latch circuit comprises:
a fuse latch circuit, having an output terminal coupled to an input terminal of each of the plurality of local latch circuits; and
a selection circuit, having a common terminal coupled to the fuse latch circuit, wherein a plurality of selection terminals of the selection circuit are coupled to the plurality of fuse circuits in a one-to-one manner, and the selection circuit is configured for selectively coupling one of the plurality of fuse circuits to the fuse latch circuit.

4. The fuse device according to claim 3, wherein the fuse latch circuit comprises:
a blown switch, having a first terminal and a second terminal respectively coupled to the common terminal of the selection circuit and a reference voltage source, wherein the blown switch is turned on when any one of the plurality of fuse circuits is blown, and the blown switch is turned off when the plurality of fuse circuits are not blown;
an enable switch, having a first terminal coupled to the common terminal of the selection circuit;
a read switch, having a first terminal and a second terminal respectively coupled to a read voltage source and a second terminal of the enable switch; and
a NOT gate, having an input terminal coupled to the second terminal of the enable switch, wherein an output terminal of the NOT gate is coupled to the output terminal of the fuse latch circuit.

5. The fuse device according to claim 4, wherein the fuse latch circuit further comprises:
a first transistor, having a first terminal and a second terminal respectively coupled to the read voltage source and the input terminal of the NOT gate, wherein a control terminal of the first transistor is coupled to the output terminal of the NOT gate;
a second transistor, having a first terminal coupled to the input terminal of the NOT gate, wherein a control terminal of the second transistor is coupled to the output terminal of the NOT gate; and
a third transistor, having a first terminal and a second terminal respectively coupled to the reference voltage source and a second terminal of the second transistor, wherein a control terminal of the third transistor is coupled to a control terminal of the read switch.

6. The fuse device according to claim 3, further comprising:
a controller, configured for generating a fuse address; and
a decoder, coupled to the controller to receive the fuse address, configured for decoding the fuse address to generate a plurality of word line signals to the selection circuit, wherein the selection circuit selects one of the plurality of fuse circuits according to the plurality of word line signals.

7. The fuse device according to claim 6, wherein the controller comprises:
an enabling signal generating circuit, configured to generate an enabling signal;
an oscillator, controlled by the enabling signal to selectively generate a clock signal; and
an address counter, coupled to the oscillator to receive the clock signal, and configured to count the clock signal to generate the fuse address to the decoder.

8. The fuse device according to claim 1, wherein each of the plurality of local latch circuits comprises:
a latch; and
a switch, having a first terminal and a second terminal respectively coupled to an output terminal of the global latch circuit and an input terminal of the latch, wherein the switch is turned on to transmit the fuse information of one corresponding fuse circuit among the plurality of fuse circuits to the input terminal of the latch when the global latch circuit reads the corresponding fuse circuit, and the switch is turned off when the global latch circuit does not read the corresponding fuse circuit.

9. The fuse device according to claim 8, further comprising:
a controller, configured for generating a source enable pulse; and
a shift register, coupled to the controller to receive the source enable pulse, configured for shifting the source enable pulse based on a clock to generate a plurality of enable pulses with different phases for the plurality of local latch circuits, wherein each of the plurality of local latch circuits latches the fuse information output by the global latch circuit according to one corresponding enable pulse among the plurality of enable pulses.

10. An operation method of a fuse device, comprising:
sensing blown states of a plurality of fuse circuits of the fuse device at different times by a global latch circuit of the fuse device;
outputting fuse information of the plurality of fuse circuits by the global latch circuit at the different times; and
latching the fuse information output by the global latch circuit at the different times by a plurality of local latch circuits of the fuse device.

* * * * *